(12) United States Patent
Salama et al.

(10) Patent No.: US 7,808,797 B2
(45) Date of Patent: Oct. 5, 2010

(54) MICROELECTRONIC SUBSTRATE INCLUDING EMBEDDED COMPONENTS AND SPACER LAYER AND METHOD OF FORMING SAME

(75) Inventors: Islam Salama, Chandler, AZ (US); Huankiat Seh, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 460 days.

(21) Appl. No.: 11/609,297

(22) Filed: Dec. 11, 2006

(65) Prior Publication Data

US 2008/0137314 A1  Jun. 12, 2008

(51) Int. Cl.
*H05K 1/18* (2006.01)

(52) U.S. Cl. ............ 361/761; 361/760; 361/734; 361/739; 361/748; 361/750; 361/757; 361/762; 361/763; 174/255; 174/256

(58) Field of Classification Search ............ 361/728, 361/729, 734, 735, 738, 739, 742, 748–751, 361/757, 758, 760–763, 766, 767, 770, 771, 361/782, 783, 790–795, 811, 812, 820, 821, 361/804, 746; 174/260–266, 255, 256
See application file for complete search history.

(56) References Cited

U.S. PATENT DOCUMENTS

| | | | |
|---|---|---|---|
| 6,019,658 A | 2/2000 | Ludwig et al. | |
| 6,291,763 B1 | 9/2001 | Nakamura | |
| 6,862,189 B2 * | 3/2005 | Higuchi | 361/767 |
| 6,879,507 B2 | 4/2005 | Abbott | |
| 7,240,429 B2 * | 7/2007 | Shiraishi et al. | 29/852 |
| 7,279,771 B2 * | 10/2007 | Sunohara et al. | 257/516 |
| 7,365,273 B2 * | 4/2008 | Fairchild et al. | 174/260 |
| 7,382,627 B2 * | 6/2008 | Borland et al. | 361/763 |
| 2004/0118602 A1 * | 6/2004 | Lee et al. | 174/260 |
| 2005/0000729 A1 * | 1/2005 | Iljima et al. | 174/260 |
| 2005/0068748 A1 * | 3/2005 | Ogawa | 361/748 |
| 2005/0218502 A1 * | 10/2005 | Sunohara et al. | 257/700 |
| 2006/0220167 A1 * | 10/2006 | Min et al. | 257/499 |
| 2009/0290316 A1 * | 11/2009 | Kariya | 361/767 |

FOREIGN PATENT DOCUMENTS

WO  PCT/US2007/085071  11/2007

* cited by examiner

*Primary Examiner*—Dameon E Levi
*Assistant Examiner*—Hoa C Nguyen
(74) *Attorney, Agent, or Firm*—Blakely, Sokoloff, Taylor & Zafman LLP

(57) ABSTRACT

A microelectronic substrate, a method of forming the same, and a system including the same. The microelectronic substrate comprises: a conductive layer; a spacer layer disposed onto the conductive dielectric layer; a dielectric build-up layer disposed onto the spacer layer, the spacer layer being made of a material that has a lower shrinkage than a material of the embedding dielectric-build-up layer during curing, and a higher viscosity than a material of the embedding dielectric build-up layer in its pre-cure form and during curing; and active or passive microelectronic components embedded within the dielectric build-up layer.

16 Claims, 3 Drawing Sheets

MICROELECTRONIC SUBSTRATE INCLUDING EMBEDDED COMPONENTS AND SPACER LAYER AND METHOD OF FORMING SAME

FIELD

Embodiments of the present invention relate generally to the field of microelectronic fabrication. More specifically, embodiments of the present invention relate to microelectronic substrates including active or passive components embedded therein.

BACKGROUND

The embedding of preformed active or passive components onto a microelectronic substrate, such as, for example, for decoupling, RF tuning or voltage regulation applications require a precise positioning of such components onto the substrate in order to allow a reliable connection of the electrical contacts, such as vias, on those components to existing conductive interconnect layers of the substrate.

Currently, embedded active and/or passive components are positioned onto a panel sized dielectric build-up layer of the substrate, and the build-up layer subsequently cured. However, disadvantageously, the viscous nature of the pre-cure dielectric build-up layer can cause significant shifts during the embedding process, and therefore cause appreciable positional errors with respect to the embedded components. Thus, prior art methods of embedding components onto microelectronic substrates can be unpredictable with respect to a reliable electrical connection and/or physical positioning of such components onto the substrate onto which they are being embedded, in this manner negatively affecting performance and yield.

Figure 1:
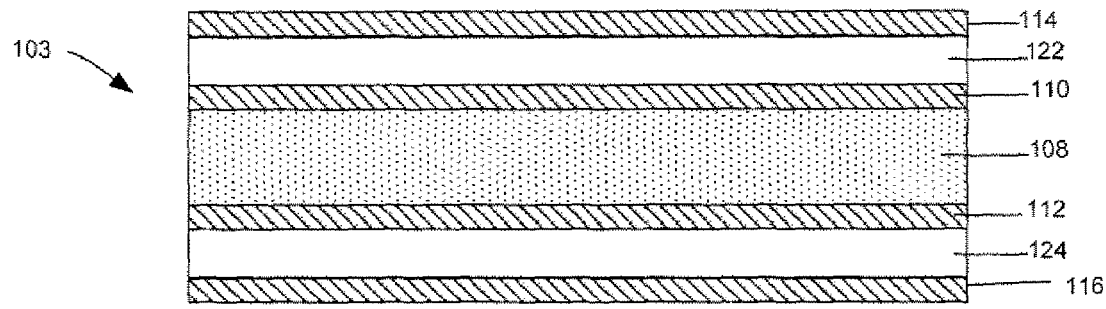
FIG. 1 is a schematic cross-sectional view of a conventional intermediate substrate including a core, conductive layers and dielectric build-up layers.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic substrate, a microelectronic package, a method of forming the substrate, a method of forming the package, and a system including the substrate are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, onto, above, below, and adjacent as used herein refer to the position of one element relative to other elements. As such, a first element disposed on, onto, above, or below a second element may be directly in contact with the second element or it may include one or more intervening elements. In addition, a first element disposed next to or adjacent a second element may be directly in contact with the second element or it may include one or more intervening elements.

Aspects of this and other embodiments will be discussed herein with respect to FIGS. 1-7, below. The figures, however, should not be taken to be limiting, as they are intended for the purpose of explanation and understanding.

Figure 6:
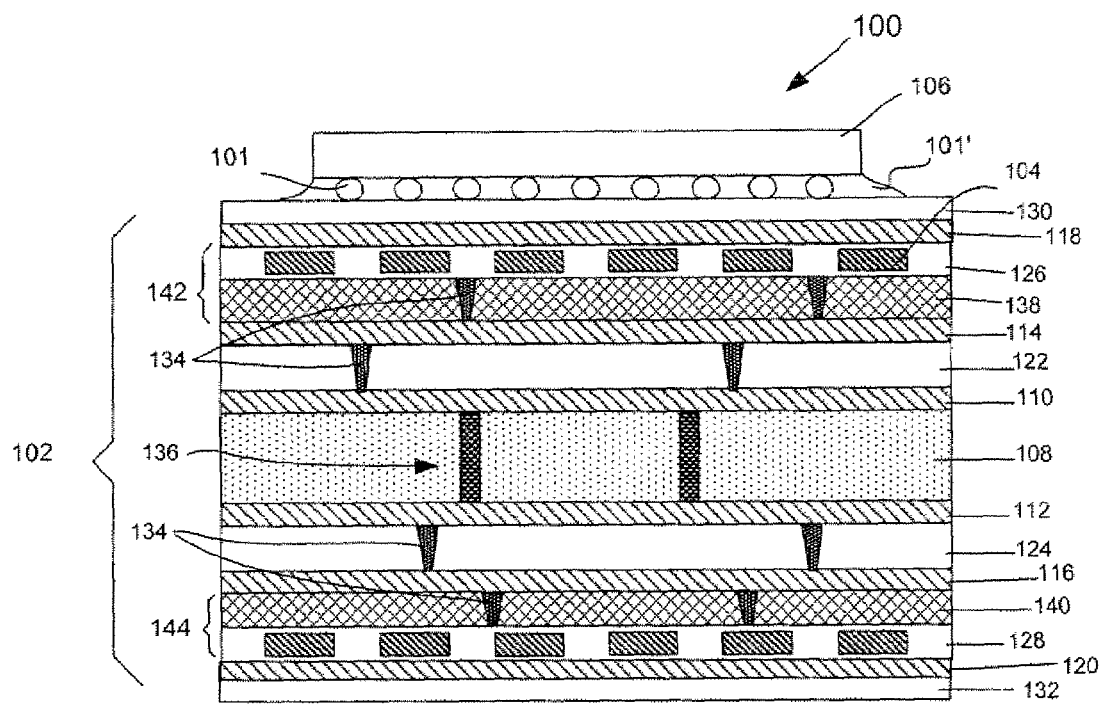
FIG. 6 is a schematic view of a package including a microelectronic substrate formed from the structure of FIG. 5.

Reference is first made to FIG. 6, which shows a package 100 including a microelectronic substrate 102 having embedded components 104 therein according to an embodiment, a microelectronic die 106 being flip-chip mounted onto the substrate 102 using solder joints 101 and an underfill material 101, in a well known manner. Other mounting configurations for the die 106 are within the purview of embodiments. As will be explained in further detail below, a package according to embodiments, such as, for example, package 100 shown in FIG. 6, is different from similar prior art packages by virtue of the presence of at least one spacer layer, such as spacer layers 138 and 140, disposed between embedded components of the substrate and the underlying conductive layer, such as between embedded components 104 and respective underlying conductive layers 114 and 116. The spacer layer according to embodiments mitigates positional errors with respect to a positioning of the embedded components as compared to a prior art structure where a spacer layer would not be used.

Referring in more detail to FIG. 6, package 100 may be used for example to couple the components 104 and/or the die 106 to a circuit board, or to couple a processor or processing system to a motherboard according to application needs. The substrate 102 includes a core 108, which may be a commercially available core using, for example, FR4, FR5 or organic materials such as Bismaleimide Triazine (BT) as the dielectric material. The core may further include a glass-reinforced epoxy PCB material with copper cladding. Other types of cores are within the purview of embodiments. The substrate 102 as shown further includes conductive layers 110, 112, 114, 116, 118 and 120, and, in addition, dielectric build-up layers 122, 124, 126, 128, 130 and 132, which layers may conform to conventional configurations for such layers as commonly used in multilayer substrate structures. The conductive layers and build-up layers are shown schematically in the figure, and it is to be understood that those layers are not necessarily continuous layers as seems to be suggested in the schematic depiction, but have a configuration adapted to allow the routing of electricity/signals at various levels within a multilayer substrate as would be readily recognized by one skilled in the art. Thus, by way of example, each of the conductive layers 110-120 may have been plated onto a corresponding build-up layer and then patterned to form traces therefrom according to application needs, each layer of traces being referred to herein as a conductive layer. Similarly, each of the dielectric build-up layers 122-132 may have been provided with vias extending therethrough, such as, for example, vias 134, in order to connect respective conductive layers to one another. Vias 136 may further be provided through the core 108 as shown according to application needs. As seen in FIG. 6, build-up layers 126 and 128 each include microelectronic components 104 embedded therein, each of the components 104 being either active or passive as dictated by a particular predetermined design for the substrate. An embedding of microelectronic components into a dielectric build-up layer, such as layers 126 or 128, is well known in the art. To the extent that the dielectric build-up layers 126 and 128 as shown in the embodiment of FIG. 6 include embedded microelectronic components therein, they may hereinafter be referred to herein as embedding dielectric build-up layers 126 and 128. The microelectronic components 104 may include preformed active or passive components. Active components would include, for example, transistors, MOSFETs, junction diodes, etc. Passive components would include, for example, capacitors, inductors, resistors, etc. The microelectronic components 104 may include components for decoupling, radio frequency tuning or voltage regulation, as would be recognized by one skilled in the art. To the extent that the conductive layers 114 and 116 "underlie" respective ones of the embedding dielectric build-up layers 126 and 128 in the sense of being adjacent to the embedding dielectric build-up layers, conductive layers 114 and 116 may sometimes be referred to herein as underlying conductive layers 114 and 116. The dielectric build-up layers 122, 124, 126, 128, 130 and 132 may for example be made of a polymeric dielectric material including, for example, ABF, such as, for example, ABF GX13.

Referring still to FIG. 6, substrate 102, according to the shown embodiment, further comprises spacer layers 138 and 140 respectively separating each of embedding build-up layers 126 and 128 from a corresponding underlying conductive layer 114 and 116. Each of the spacer layers may be made of a material that has a lower shrinkage than a material of the embedding dielectric-build-up layer during curing, and a higher viscosity than a material of the embedding dielectric build-up layer in its pre-cure form and during curing. A material of the embedding dielectric build-up layers is in a "pre-cure" form as used herein when it is in a phase thereof prior to a full curing of the same, at which point it would yield the material of the embedding dielectric build-up layers. Thus, during a curing of the embedding dielectric build-up layers, such as layers 126 and 128, while the embedding dielectric build-up layers may shrink and flow during and after curing, the material of the spacer layer would shrink less and flow less during such curing according to embodiments, in this way ensuring a more reliable positioning of the microelectronic components being embedded within the embedding dielectric build-up layers after a curing of the layers 126 and 128 has been effected. A spacer layer according to embodiments may further: (1) be made of a material that is adapted to bond with the underlying conductive layer of a substrate, such as, for example, by being laminated thereon or through other bonding processes as would be recognized by one skilled in the art; (2) have a viscosity adapted to allow the spacer material to flow within discontinuities present in the underlying conductive layer of the substrate; (3) have a dielectric constant that is within about 20% of a dielectric constant of the embedding dielectric build-up layer corresponding thereto, and, preferably, within a percentage between about 5% and about 20% of a dielectric constant of the embedding dielectric build-up layer corresponding thereto; (4) made of a material having a cure temperature that is lower than or equal to a cure temperature of the pre-cure dielectric material; and/or (5) made of a material that is adapted to be laser drilled for the formation of via holes. According to one embodiment, the material of the spacer layer may have a dielectric constant that is substantially identical to a dielectric constant of the embedding dielectric build-up layer corresponding thereto. According to a preferred embodiment, the spacer layers 138 and 140 are made of a prepreg material, such as, for example, a polyamide prepreg or an epoxy prepreg having a silicon or glass filler. Where the spacer layer includes a prepreg according to an embodiment, a choice of the specific type of prepreg would depend on application requirements, such as, for example, requirements (1)-(5) listed above for the material of the spacer layer. An embodiment contemplates using prepreg (GX13-PP) along with ABF (GX13) as the dielectric build-up layer overlying the same. A presence of particulate matter in a prepreg according to an embodiment, such as, for example, the presence of silicon oxide particles, allow the prepreg to be more viscous than a material of the corresponding embedding dielectric build-up layer before and during curing of the embedding dielectric build-up layer. Embodiments are not limited to the use of a spacer layer made of a single material, but include within their scope a spacer layer made of differing materials throughout a volume thereof, such as, for example, a spacer layer including a number of sublayers of differing materials.

The spacer layer advantageously allows the maintenance of a predetermined separation between two successive conductive layers sandwiching a given embedding dielectric build-up layer therebetween. The predetermined separation refers to a total thickness of all of the layers present between the two successive conductive layers mentioned above. Hereinafter, for ease of reference, the totality of all of the layers present between the two successive conductive layers will be referred to as "component support layer," which is shown by way of example in FIG. 6 as either component support layer 142 including spacer layer 138 and embedding dielectric build-up layer 126, or as component support layer 144 including spacer layer 140 and embedding dielectric build-up layer 128. The predetermined separation according to an embodiment in particular refers to a minimum thickness of the component support layer adapted to achieve a desired signal integrity within the substrate. An exemplary value for the predetermined separation is about 30 microns. Such minimum thickness may be determined among others from an effective dielectric constant of the component support layer. By "effective dielectric constant," what is meant in the context of the instant description is a value of a dielectric constant applicable to the component support layer as if the component support layer were made of a single material throughout a volume thereof. In determining the predetermined separation, both capacitance and resistance of the embedded components may be taken into consideration. A person skilled in the art would recognize that resistance would need to be relatively high in order to prevent a high leakage and capacitance/dielectric constant needs to be relatively low to prevent a high signal impedance. A determination of the predetermined separation would then result from impedance matching, which would be brought about by ascertaining that there are no significant impedance changes along signal pathways through the substrate. Impedance matching is well known in the art. Choosing a spacer layer having a material that has a similar dielectric constant to that of the capacitor dielectric build-up layer would allow the spacer layer to effectively replace the capacitor dielectric-build-up layer for electrical purposes. Another factor in determining the predetermined separation is a consideration of a density and thickness of the underlying conductive layer 114 by ensuring that the spacer layer is thick enough to penetrate in discontinuities present in layer 114. The use of a spacer layer according to embodiments, such as spacer layers 138 and 140, allows the maintenance of a predetermined separation as defined above while advantageously decreasing a thickness of the embedding dielectric build-up layer such as layers 126 and 128, respectively. Less embedding dielectric build-up layer along with the use of a spacer layer advantageously lead to a reduced viscous flow of the component support layer during a curing of the embedding dielectric build-up layer, thus bringing about a more reliable positioning of the embedded components in the final product. According to embodiments, a spacer layer may have a thickness that is about 30% to about 70% of the component support layer.

Reference will next be made to FIGS. 1-5, which show different stages in the formation of a substrate such as substrate 102 of FIG. 6 described above. Although FIGS. 1-5 show the provision of a component support layer, including spacer layer and embedding dielectric build-up layer, on one side of an intermediate substrate, such as intermediate substrate 103 of FIG. 1, it is to be understood that processes described in relation to FIGS. 1-5 may be used to provide component support layers on both sides of an intermediate substrate. In addition, the processes described in relation to FIGS. 1-5 may equally as well be applied to provide any number of component support layers on any given side of an intermediate substrate, as would be recognized by one skilled in the art. To the extent that the structures shown in FIGS. 1-5 represent stages in the fabrication of a substrate such as substrate 105 of FIG. 6, components in FIGS. 1-5 corresponding to similar components in FIG. 6 have been indicated with like reference numerals. It is further noted that a depiction of the conductive vias shown in FIG. 6 have been omitted from the structures of FIGS. 1-5 for the sake of clarity of illustration.

Referring first to FIG. 1, a method embodiment comprises providing an intermediate substrate, such as intermediate substrate 103. By "intermediate substrate," what is meant in the context of the instant description is a multilayer substrate structure prior to the provision thereon of an embedding dielectric build-up layer. The intermediate substrate in FIG. 1 includes the core layer 108, the conductive layers 110, 112, 114 and 116, and the dielectric build-up layers 122 and 124 already described above with respect to the embodiment of FIG. 6. The provision of an intermediate substrate such as substrate 103 is well known in the art, and, as a result, a fabrication of the same will not be described herein. A provision of an intermediate substrate as shown by way of example in FIG. 1 entails the provision of conductive layer 114, which corresponds to underlying conductive layer 114 as described above in relation to FIG. 6.

Figure 2:
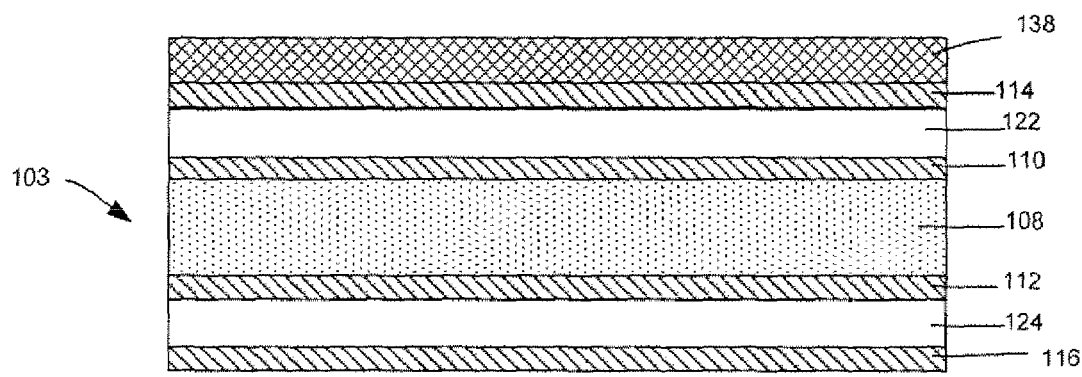
FIG. 2 is a schematic view of a first intermediate structure including the intermediate substrate of FIG. 1 further having a spacer layer thereon according to an embodiment.

Referring next to FIG. 2, a method embodiment comprises providing a spacer layer, such as spacer layer 138, onto the underlying conductive layer, such as underlying conductive layer 114. Preferably, as noted above in relation to FIG. 6, the spacer layer includes a prepreg layer. The spacer layer 138 may be laminated onto the underlying conductive layer 114 in a well known manner. According to a preferred embodiment, the provision of the spacer layer comprises laminating a prepreg layer 138 onto the underlying conductive layer 114. Lamination of the prepreg layer may take place according to an embodiment within a temperature range of about 100 degrees Celsius to about 150 degrees Celsius. The spacer layer may be provided onto the underlying conductive layer in any other well known manner, such as through the use of a spin-on/spray-on and cure technique, depending on the material of the spacer layer. A determination of process parameters for the lamination of a prepreg layer onto a conductive layer would depend among other things on the type of prepreg material being used, as would be recognized by one skilled in the art. Embodiments are not, however, limited to the provision of a spacer layer via lamination, and include within their scope the provision of a spacer layer according to any one of well known methods of providing one layer onto another layer as would be recognized by one skilled in the art. During a provision of the spacer layer 138, preferably, the spacer layer possesses a viscosity of allow a flowing of a material of the same in between irregularities on the surface of the underlying conductive layer 114. After the provision of spacer layer 138, the spacer layer may be provided with conductive vias (shown in FIG. 6), such as, for example, by way of laser drilling and electroplating, in a well known manner.

Figure 3:
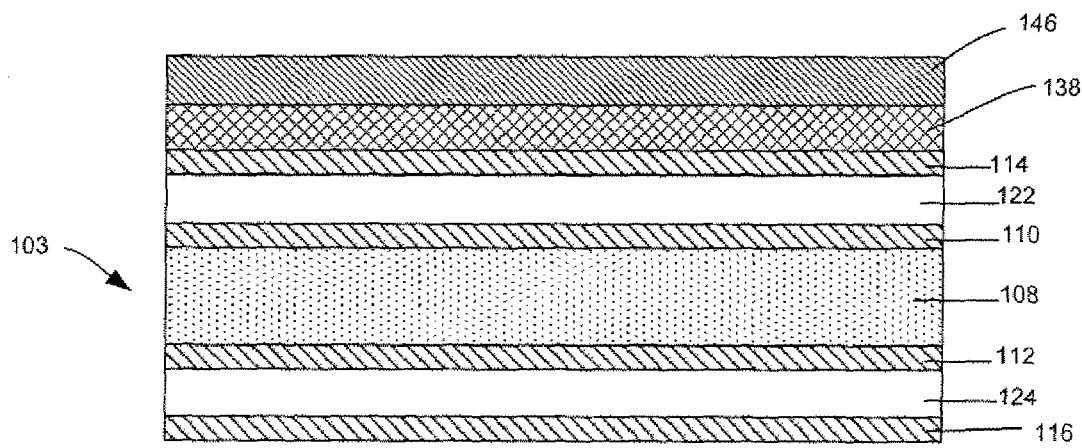
FIG. 3 is a schematic view of a second intermediate structure including the structure of FIG. 2 further having an pre-cure dielectric build-up layer thereon.

Referring next to FIG. 3, a method embodiment comprises providing a pre-cure dielectric build-up layer, such as pre-cure dielectric build-up layer 146, onto the spacer layer, such as onto spacer layer 138. The pre-cure dielectric build-up layer 146 shown in FIG. 3 in its "pre-cure" form, that is, as described above, in a phase prior to its full curing after embedding of components 104 therein (as will be described in further detail in relation to FIGS. 4 and 5). The pre-cure dielectric build-up layer 146 may correspond to a pre-cure form of any of possible materials listed for the embedding dielectric build-up layer 126 described in relation to FIG. 6 above. Preferably, the pre-cure dielectric build-up layer 146 is laminated onto the spacer layer 138 in a well known manner. Optionally, the pre-cure dielectric build-up layer 146 may be partially cured in a well known manner in order to increase its viscosity prior to and during an embedding of components 104 therein.

Figure 4:
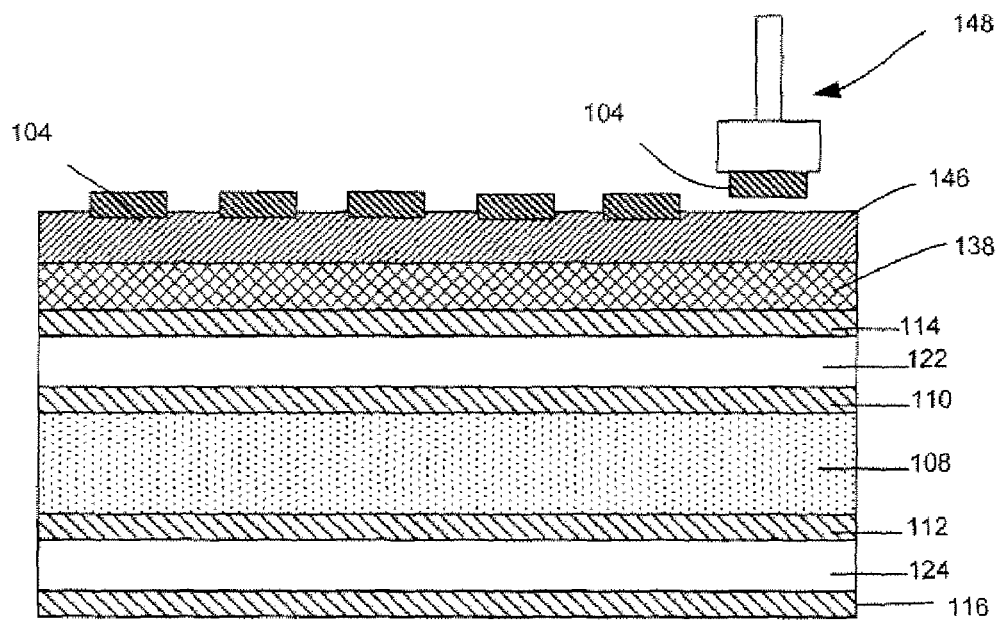
FIG. 4 is a schematic view of a third intermediate structure including the structure of FIG. 3 in the process of being provided with components being embedded into the pre-cure dielectric build-up layer.

Referring next to FIG. 4, a method embodiment comprises embedding active or passive components, such as components 104, within the pre-cure dielectric build-up layer, such as layer 146. Embedding may take place according to any one of conventional methods for embedding active or passive components within a dielectric layer, such as, for example, by using a mounter 148.

Figure 5:
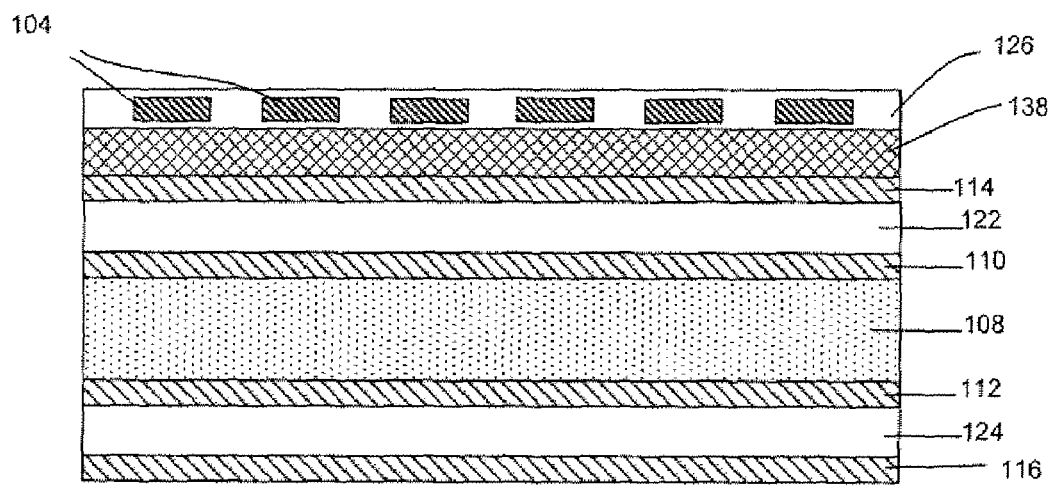
FIG. 5 is a schematic view of a fourth intermediate structure including the structure of FIG. 4 after a curing of the pre-cure dielectric build-up layer.

Referring next to FIG. 5, a method embodiment comprises curing the pre-cure dielectric build-up layer after embedding, such as curing the layer 146. Curing may take place according to any one of conventional methods for curing a dielectric material. For example, the structure shown in FIG. 4 may be placed in a cure oven at a temperature range of about 200 degrees Celsius in order to bring about a curing of the dielectric layer 146 in a well known manner. A curing of the pre-cure dielectric build-up layer 146 yields the embedding dielectric build-up layer 126 as described in relation to FIG. 6 above. A curing of the pre-cure dielectric build-up layer 146 may also bring about a curing of the spacer layer. Before and during curing, both the pre-cure dielectric build-up layer and the spacer layer may exhibit some flow, and the components 104 may sink into the pre-cure dielectric build-up layer, and, in some embodiments, into the spacer layer as shown in FIG. 5. After curing, the embedding dielectric build-up layer may be provided with conductive vias (shown in FIG. 6), such as, for example, by way of laser drilling and electroplating, in a well known manner. Subsequent to curing, additional layers, such as additional conductive and dielectric build-up layers may be provided onto the embedding dielectric build-up layer 126 in a conventional manner, and provided with conductive vias in a conventional manner, in order to yield a substrate similar to substrate 102 of FIG. 6.

Advantageously, embodiments provide a spacer layer between an underlying conductive layer and an embedding dielectric build-up layer of a multilayer substrate in order to mitigate positional errors of components embedded in the build up layer while maintaining a predetermined separation between two successive conductive layers sandwiching the embedding dielectric build-up layer therebetween. Moreover, advantageously, embodiments provide a mitigation of positional errors while at the same time allowing the use of existing and established processes for forming a multilayer substrate. Furthermore, advantageously, embodiments allow the use of enough dielectric build-up material as the embedding build-up layer to provide adequate adhesion of the embedded components to the rest of the substrate.

Figure 7:
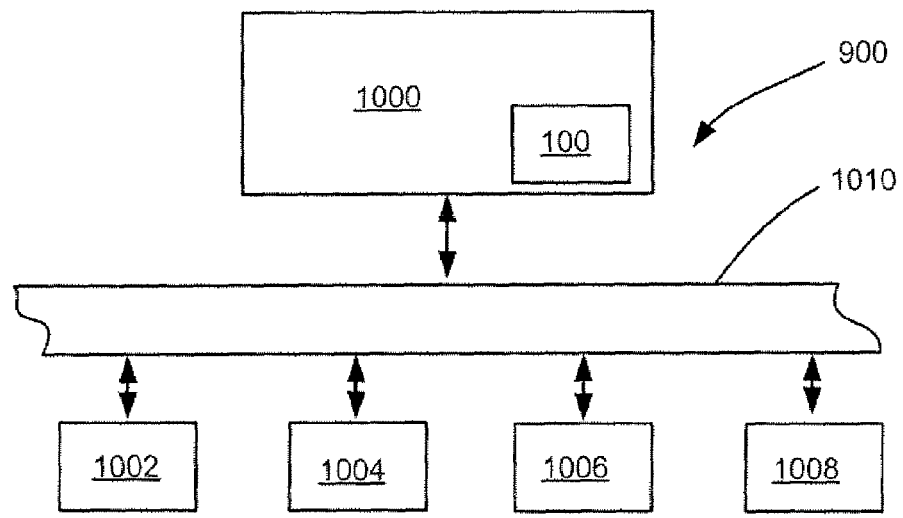
FIG. 7 is a schematic view of a system including a microelectronic substrate similar to the substrate of FIG. 6.

Referring to FIG. 7, there is illustrated one of many possible systems 900 in which embodiments of the present invention may be used. In one embodiment, the electronic assembly 1000 may include a microelectronic package such as package 100 of FIG. 6. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 7, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic substrate comprising:
a core layer;
a conductive layer formed above said core layer;
a spacer layer disposed onto the conductive layer;
a dielectric build-up layer disposed onto the spacer layer, the spacer layer being made of a material that has a lower shrinkage than a material of the dielectric-build-up layer during curing, and a higher viscosity than the material of the dielectric build-up layer in its pre-cure form and during curing; and
active or passive microelectronic components embedded within the dielectric build-up layer.

2. The substrate of claim 1, wherein the spacer layer comprises a prepreg layer.

3. The substrate of claim 2, wherein the prepreg layer comprises one of a polyamide and an epoxy resin and a filler material.

4. The substrate of claim 1, wherein the spacer layer has a thickness that is between about 30% and about 70% of a thickness of the spacer layer and of the dielectric build-up layer combined.

5. The substrate of claim 1, wherein the conductive layer is a second conductive layer and the dielectric build-up layer is a second dielectric build-up layer, a first conductive layer disposed onto the core layer, and a first dielectric build-up layer disposed onto the first conductive layer, the second conductive layer being disposed onto the first dielectric build-up layer.

6. The substrate of claim 5, wherein the core comprises an organic material.

7. The substrate of claim 5, wherein the dielectric build-up layers comprise ABF.

8. A microelectronic package comprising:
a microelectronic substrate comprising:
a core layer;
a conductive layer formed above said core layer;
a spacer layer disposed onto the conductive layer;
a dielectric build-up layer disposed onto the spacer layer, the spacer layer being made of a material that has a lower shrinkage than a material of the dielectric-build-up layer during curing, and a higher viscosity than the material of the dielectric build-up layer in its pre-cure form and during curing; and
active or passive microelectronic components embedded within the dielectric build-up layer; and
a microelectronic die mounted onto the microelectronic substrate.

9. The package of claim 8, wherein the spacer layer comprises a prepreg layer.

10. The package of claim 9, wherein the prepreg layer comprises one of a polyamide and an epoxy resin and a filler material.

11. The package of claim 8, wherein the spacer layer has a thickness that is between about 30% and about 70% of a thickness of the spacer layer and of the dielectric build-up layer combined.

12. The package of claim 8, wherein the conductive layer is a second conductive layer and the dielectric build-up layer is a second dielectric build-up layer, a first conductive layer disposed onto the core layer, and a first dielectric build-up layer disposed onto the first conductive layer, the second conductive layer being disposed onto the first dielectric build-up layer.

13. The package of claim 12, wherein the core comprises an organic material.

14. The package of claim 12, wherein the dielectric build-up layers comprise ABF.

15. A system comprising:
an electronic assembly including:
a microelectronic substrate comprising:
a core layer;
a conductive layer formed above said core layer;
a spacer layer disposed onto the conductive layer;
a dielectric build-up layer disposed onto the spacer layer, the spacer layer being made of a material that has a lower shrinkage than a material of the dielectric-build-up layer during curing, and a higher viscosity than a material of the dielectric build-up layer in its pre-cure form and during curing, and
active or passive microelectronic components embedded within the dielectric build-up layer; and
a main memory coupled to the electronic assembly.

16. The system of claim 15, wherein the spacer layer comprises a prepreg layer.

* * * * *